United States Patent
Kawai

(10) Patent No.: US 6,239,033 B1
(45) Date of Patent: May 29, 2001

(54) MANUFACTURING METHOD OF SEMICONDUCTOR DEVICE

(75) Inventor: Hiroji Kawai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/316,044

(22) Filed: May 21, 1999

(30) Foreign Application Priority Data

May 28, 1998 (JP) .................................................. 10-147492

(51) Int. Cl.$^7$ .................................................. H01L 21/304
(52) U.S. Cl. ............................ 438/693; 438/47; 438/759
(58) Field of Search ............................... 438/47, 285, 759, 438/693, 977, FOR 111, FOR 289, FOR 286, FOR 485

(56) References Cited

U.S. PATENT DOCUMENTS

| | | | |
|---|---|---|---|
| 5,607,718 | * | 3/1997 | Sasaki et al. . |
| 5,626,715 | * | 5/1997 | Rostoker . |
| 5,861,055 | * | 1/1999 | Allman et al. . |
| 5,932,486 | * | 8/1999 | Cook et al. . |
| 5,985,687 | * | 11/1999 | Bowers et al. . |

* cited by examiner

Primary Examiner—George Fourson
Assistant Examiner—Joannie A. Garcia
(74) Attorney, Agent, or Firm—Sonnenschein, Nath & Rosenthal

(57) ABSTRACT

After making a GaN FET by growing GaN semiconductor layers on the surface of a sapphire substrate, the bottom surface of the sapphire substrate is processed by lapping, using an abrasive liquid containing a diamond granular abrasive material and reducing the grain size of the abrasive material in some steps, to reduce the thickness of the sapphire substrate to 100 $\mu$m or less. Thereafter, the bottom surface of the sapphire substrate is processed by etching using an etchant of phosphoric acid or phosphoric acid/sulfuric acid mixed liquid to remove a strained layer by lapping. Then, after making a via hole by etching the bottom surface of the sapphire substrate by using a similar etchant, the GaN semiconductor layer at the bottom of the via hole is removed by RIE to expose a Au pad electrically connected to the source of GaN FET. Thereafter, a thick Au film electrically connected to the Au pad is made through the via hole. The via hole may be made by irradiation of a pulse laser beam from a $CO_2$ laser and subsequent etching.

8 Claims, 8 Drawing Sheets

MANUFACTURING METHOD OF SEMICONDUCTOR DEVICE

RELATED APPLICATION DATA

The present application claims priority to Japanese Application No. P10-147492 filed May 28, 1998, which application is incorporated herein by reference to the extent permitted by law.

BACKGROUND OF THE INVENTION

1. Field of the Invention

This invention relates to a semiconductor device and its manufacturing method, and especially those using nitride III-V compound semiconductors such as gallium nitride (GaN).

2. Description of the Related Art

Nitride III-V compound semiconductors constraining GaN as the major component are direct transitional semiconductors having forbidden band widths ranging from 1.9 eV to 6.2 eV and enabling realization of light emitting devices theoretically capable of emitting light over a wide range from the visible spectrum to the ultraviolet. For these properties, semiconductor light emitting devices using GaN semiconductors have been placed under active developments. Additionally, GaN semiconductors have a large possibility as material of electron mobility devices. Saturation electron velocity of GaN is approximately $2.0 \times 10^7$ cm/s, which is larger than those of GaAs and SiC, and its breakdown electric field is as large as approximately $5 \times 10^6$ V/cm next to the intensity of diamond. For these natures, GaN semiconductors have been expected to be greatly hopeful as materials of high-frequency, high-power semiconductor devices.

For manufacturing transistor using such a GaN semiconductor, it is necessary to grow the GaN semiconductor by chemical vapor deposition (CVD) or molecular beam epitaxy (MBE), and a sapphire substrate is often used as the substrate therefor. However, although thermal conductivity of GaN at the room temperature is 1.3 W/cmK and larger than thermal conductivity 0.3 W/cmK of GaAs at the room temperature, thermal conductivity of sapphire at the room temperature is 0.4 W/cmK similarly to that of GaAs, and as small as approximately 1/12 when compared with thermal conductivity 4.9 W/cmK of SiC at the room temperature. Therefore, it has been pointed out that a GaN field effect transistor (FET) for a high output power made by growing a GaN semiconductor on a sapphire substrate was especially bad in heat dissipation during operation and was liable to deteriorate in characteristics ((1) Inst. Phys. Conf. Ser. No. 142, 765 (1996)). Therefore, improvement of heat dissipation characteristics is indispensable to ensure a high output power of a GaN FET. On the other hand, for operating the GaN FET at a high frequency its source inductance has to be reduced.

As basic technologies for realizing GaAs FETs for higher operative frequencies and higher output power relying on reduction of the source inductance, there have conventionally been techniques for thinning a GaAs substrate, and techniques for making a via hole in a GaAs substrate and making electric connection to the source from the bottom surface of the substrate through the via hole. These techniques are summarized below ((2) Fundamentals of GaAs Field Effect Transistors, Denshi Joho Tsushin Gakkai, 1992, p.207; (3) U.S. Pat. No. 4,015,278; (4) Int. Electron Device Meet., Tech. Dig., 676 (1981)).

For thinning a GaAs substrate, first conducted primary lapping using a granular abrasive material of SiC or alumina. Then, by using abrasive grains of a grain size of 1 $\mu$m or less of $CeO_2$, $ZrO_2$, $CrO_2$, or the like, the substrate is polished on a soft polisher such as synthetic resin or artificial leather to remove processing strain by lapping. As a result, the remainder depth of the processing strain is reduced to 10 $\mu$m or less, but additional processing by wet etching may be applied. As to the via hole to be made in the GaAs substrate, since GaAs is readily dissolved by any of sulfuric acid/hydrogen peroxide solution or alkali solution, wet etching using such solution as the etchant is essentially sufficient for making the via hole. However, since side etching becomes large with wet etching and it is difficult to control the shape of the via hole, reactive ion etching (RIE) or ion milling is used normally. When using RIE for making the via hole, an etching rate as high as 50 to 100 $\mu$m/hr can be obtained, and the via hole can be made easily, by using a mixed gas of $CCl_2F_2$ and He as the etching gas and using a silicon oxide ($SiO_2$) film or an organic resist film as the etching mask. Since GaAs substrates are readily processed either mechanically or chemically as mentioned above, high-frequency operation and high-power output of GaAs FETs have already been realized by thinning the substrate and making the via hole in the substrate.

However, it is difficult to employ the technique successfully used in GaAs FETs for thinning the substrate and making the via hole in the substrate also for fabrication of GaN FETs. As referred to above, sapphire substrates are often used for manufacturing GaN FETs. Sapphire, however, is much harder than GaAs, and it is extremely difficult to reduce the thickness of the sapphire substrate by using the above-explained conventional lapping technology. If it is forcibly thinned by lapping, it will large curve due to a lapping strain to be concave on the major surface side where the device should be made, and it will finally break down. Also regarding the via hole to be made in the sapphire substrate, since sapphire is very stable in chemical property, wet etching cannot be used without any effective etchant. As to dry etching by RIE, since its etching rate is as very low as several um/hr in maximum, and there is no etching mask having a selectivity acceptable for selective etching. Therefore, it is actually impossible to make the via hole with any of these methods. So, when making GaN FET on a sapphire substrate, it has been difficult to realize high-frequency operation and high-power output relying on thinning the substrate and making the via hole.

The above-made discussion applies to the case where GaN FET is made on a sapphire substrate. However, the same problem also lies in the case where GaN FET is made on a SiC substrate which is very had and chemically stable similarly to sapphire substrates.

On the other hand, FIG. 1 shows a conventional GaN semiconductor laser. As shown in FIG. 1, in the GaN semiconductor laser, sequentially stacked on a c-plane sapphire substrate 101 are a GaN buffer layer 102, n-type GaN contact layer 103, n-type AlGaN cladding layer 104, n-type GaN optical guide layer 105, active layer 106 with a $Ga_{1-x}In_xN/Ga_{1-y}In_yN$ multi quantum well structure, p-type GaN optical guide layer 107, p-type AlGaN cladding layer 108 and p-type GaN contact layer 109. An upper-lying portion of the n-type GaN contact layer 103, n-type AlGaN cladding layer 104, n-type GaN optical guide layer 105, active layer 106 with the $Ga_{1-x}In_xN/Ga_{1-y}In_yN$ multi quantum well structure, p-type GaN optical guide layer 107, p-type AlGaN cladding layer 108 and p-type GaN contact layer 109 have a mesa configuration of a predetermined width. Additionally, a p-side electrode 110 is made on the p-type GaN contact layer 109 in ohmic contact therewith, and an n-side electrode 111 is made in ohmic contact on a location of the n-type GaN contact layer 103 adjacent to the mesa portion.

However, in the conventional GaN semiconductor laser shown in FIG. 1, since the n-side electrode 111 is made on the location of the n-type GaN contact layer 103 adjacent to the mesa portion, the current supplied between the p-side electrode 110 and the n-side electrode 111 during operation must flow along the n-type GaN contact layer 103. Therefore, the current path was long, and this resulted in increasing the operation voltage. Moreover, Since the GaN semiconductor laser has a structure locating both the p-side electrode 110 and the n-side electrode 111 on the bottom surface of the substrate, it was impossible to use an apparatus used for assembling GaAs semiconductor lasers having the p-side electrode on the top surface of the substrate and the n-side electrode on the bottom surface of the substrate. Therefore, the GaN semiconductor laser required a special assembling apparatus, and this invited an increase of the manufacturing cost.

OBJECTS AND SUMMARY OF THE INVENTION

It is therefore an object of the invention to provide a semiconductor device which can be improved for high-frequency operation and/or high-power output by the use of a thinned substrate and/or a via hole in the substrate even when a device using nitride III-V compound semiconductors is made on a single-crystal substrate such as sapphire substrate or SiC substrate, which is hard and chemically stable, and to provide a manufacturing method capable of easily manufacturing such a semiconductor device.

Another object of the invention is to provide a semiconductor device reduced in operation voltage of a light emitting element and decreased in manufacturing cost by the use of a via hole in its substrate when the light emitting element is made by using nitride III-V compound semiconductors on a non-conductive single-crystal substrate such as sapphire substrate, and to provide a manufacturing capable of easily manufacturing such a semiconductor device.

The Inventor made researches, summarized below, toward overcoming the above-indicated problems involved in the conventional techniques.

For thinning a sapphire substrate already having formed a device using GaN semiconductors, there are some problems to solve. One of the problems is to thin the substrate sufficiently, namely to a thickness around 100 $\mu$m, for example, decades of $\mu$m, in the process of thinning the sapphire substrate by using lapping or other method, without damaging the device on the surface of the substrate, while minimizing the processing strain and preventing warpage or breakage of the substrate. when using a sapphire substrate, unlike the case using a GaAs substrate, warpage causes difficulties in subsequent processes unless substantially all of the strain in the thinned substrate is removed finally. Another problem is to find out an optimum processing method for making the via hole in any desired location of the sapphire substrate. Use of molten coral sand around 900° C. and use of molten phosphoric acid around 400° C. are known as methods for wet etching of sapphire. The Inventor made reviews to estimate applicability of these methods as a technique for making the via hole in a sapphire substrate and also to find out possible materials usable as an etching mask in the technique. The Inventor further made researches to find out a new simple method for making the via hole without using the etching mask.

When a substrate of a hard material such as sapphire substrate is sued, diamond powder is a sole granular abrasive material acceptable for use in lapping. In general, thickness of the layer changed in quality or strained by lapping processing approximately amounts several times the grain size of the abrasive grains used there. Therefore, if the substrate should be thinned to a thickness around 20 nm, for example, since the thickness of the sapphire substrate before being thinned is usually about 400 $\mu$m, for thinning it, it is first processes by lapping, using an abrasive liquid containing diamond granular abrasive material with the grain size of 30 $\mu$m, for example. In this case, if it is further thinned, then the ratio of the strained layer relative to the remainder substrate will increase, and a large strain will invite warpage or breakage of the substrate. Then, by using a diamond granular abrasive material with a smaller grain size as large as 10 $\mu$m, for example, it is processed by lapping to a thickness around 100 $\mu$m, for example. As a result, the strained layer made by the preceding lapping can be removed. However, another strained layer of a thickness of decades of $\mu$m newly appears. Therefore, by next using an abrasive liquid containing a granular abrasive material with a grain size around 1 $\mu$m, for example, it is processed by lapping or polishing to a thickness around 40 $\mu$m.

In case of GaAs substrates, the strained layer produced by lapping has been fully removed conventionally by mechano-chemical polishing. More specifically, it has been known that the strained layer can be removed completely by polishing the substrate in hypochlorous acid solution containing micro soft grains. However, As to sapphire substrates, no polishing in such solution has been known. Then, consideration is made on using the following method. That is, an appropriate amount of sulfuric acid is added to phosphoric acid, and the temperature is held at 280° C. This liquid has an etching rate around 10 um/hr for sapphire. High-temperature phosphoric acid has been known to have an etching function of sapphire (for example, (5) Ceramics Processing Handbook, Kensetsu Sangyo Chosakai (1987)). However, direct exposure of a device to such a high-temperature corrosive solution invites characteristic deterioration of the device and wiring. Therefore, there is the need for a countermeasure to ensure that phosphoric acid never touches the device side. For this purpose, a first effective measure is to bring only the bottom surface into contact with the liquid, and a second effective measure is to make a protective film on the device side. Effective as the protective film are a SiO$_2$ film made by CVD, oxide or nitride film such as SiN film having a resistance to phosphoric acid, and heat-resistant polyimide film, for example.

For making the via hole, dry etching such as conventional RIE cannot be employed. Then, consideration is made on using the following method. That is, as shown in FIG. 2, for example, after growing a GaN semiconductor layer 2 with a thickness of several $\mu$m in total, for example, on the surface of a sapphire substrate 1, and a GaN FET 3 is formed on the GaN semiconductor layer 2. After that, a metal wiring and a pad for the GaN FET 3 are made. Reference numeral 4 denotes a Au pad electrically connected to the source of the GaN FET 3. Thereafter, an inter-layer insulating film 5 such as SiO$_2$ film is formed on the GaN semiconductor layer 2 to cover the Au pad 4. Subsequently, the sapphire substrate 1 is thinned to a thickness of 100 $\mu$m or less, for example to a thickness around decades of $\mu$m. After that, the bottom surface of the sapphire substrate 1 is covered locally at the location for the via hole by a multi-layered etching mask 6 made by stacking metal thin films. Used as the multi-layered film is, for example, a two-layered film stacking a thin film of a metal resistant to phosphoric acid, such as Pt, Au, Pd, or the like, on a thin film of a metal well adhesive to the sapphire substrate, such as Ni, Cr, Ti, or the like. On the other hand, a protective film of polyimide, for example, is formed on the surface of the inter-layer insulating film 5. Thereafter, the bottom surface side of the sapphire substrate 1 is immersed into an etchant of phosphoric/sulfuric acid solution held at approximately 280° C., for example, to etch it. In this case, since the etching rate is approximately 10 $\mu$m/hr, the etching time is adjusted depending upon the thickness of the sapphire substrate 1. In this manner, as shown in FIG. 3, the via hole 8 is made in the sapphire substrate 1. Then, next using RIE, part of the GaN semiconductor layer 2 exposed at the bottom of the via hole 8 is removed by etching to expose the Au pad 4 there. In the process of etching the GaN semiconductor layer 2, if $Cl_2$ gas is used as the etching gas, since the etching rate is 5 to 10 $\mu$m/hr and the ratio of the etching rate for Au is approximately 3 or more, a sufficient thickness of the Au pad 4 can be maintained even after etching the GaN semiconductor layer to a slightly over-etching level, if the Au pad 4 originally has a thickness around 1 $\mu$m or more. It may occur that the etching mask 6 on the bottom surface of the sapphire substrate 1 is removed while the GaN semiconductor layer 2 is etched by RIE. However, it is immaterial.

After that, a metal film thicker than the sapphire substrate 1 is formed on the bottom surface of the sapphire substrate 1 to contact with the Au pad through the via hole 8. When making the metal film, after stacking, in sequence, Ni or Cr and Au on the bottom surface of the sapphire substrate 1 by vacuum evaporation, for example, a Au film with a sufficient thickness, for example, from decades of $\mu$m to hundreds of $\mu$m, is deposited on the metal layers by plating, for example. The thin, plate-like metal film made in this manner makes electric connection with the source of the GaN FET 3 and functions to radiate heat.

On the other hand, as an alternative method for making the via hole in the sapphire substrate, there is a method using a pulse laser beam. That is, sapphire absorbs infrared rays with wavelengths longer than approximately 6 $\mu$m. Taking it into account, by irradiating a pulse laser beam from a $CO_2$ laser with the wavelength of 10.6 $\mu$m, for example, to the sapphire substrate, it is locally heated to a very high temperature to cause ablation of sapphire. This is a technique brought into practical use for scribing alumina substrates. More specifically, by irradiating a single pulse of laser beam with the peak output of 300 W, pulse width of 200 ps, and beam diameter of approximately 100 $\mu$m, for example, a hole of a depth around 200 $\mu$m can be made in the alumina substrate. Therefore, as shown in FIG. 4, for example, after making a hole with a depth around 50 $\mu$m, for example, by irradiating a pulse laser beam 9 from a $CO_2$ laser to a desired location on the bottom surface of the sapphire substrate 1 with a thickness around 200 $\mu$m, by uniformly etching the location to the depth of about 150 $\mu$m, for example, using an etchant of phosphoric acid/sulfuric acid solution heated to a high temperature, the via hole 8 as shown in FIG. 5 can be made. This method is a maskless process, and therefore needs much less steps.

Here again explained are merits of thinning sapphire substrates. As shown in FIG. 6, thermal conductivity of sapphire is as small as approximately 0.4 W/cmK at the room temperature and has a large negative gradient relative to temperature, that is, it becomes lower as the temperature rises. In the case where a device using GaN semiconductors on a sapphire substrate, heat from the device during operation moves to the sapphire substrate due to heat conduction. In case of a high-power device, heat is radiated through a heat sink typically made on the bottom surface of the substrate. However, the fact that heat conductivity of sapphire decreases with increase of temperature means that heat radiation becomes difficult as the temperature rises. Therefore, from the viewpoint of heat radiation, it is advantageous that the sapphire substrate supporting the device is as thin as possible, and it is preferable to thin the substrate to the limit within a range acceptable for mechanical strength. By thinning in this level, efficient heat radiation is ensured, and the increase in temperature can be alleviated.

The above-made discussion applies to the case where a sapphire substrate is used. However, it is also applicable to the case where other single-crystal substrates like SiC substrate, for example, are used.

On the other hand, when first making GaN semiconductor layers forming a GaN light emitting device on a non-conductive single-crystal substrate such as sapphire substrate, for example, next making a via hole in the single-crystal substrate from its bottom surface in the same manner as explained above to expose the lower surface of the GaN semiconductor layer, thereafter making one of the electrodes on the bottom side of the single-crystal substrate to be in contact with the GaN semiconductor layer from the lower side through the via hole, and making the other electrode on the GaN semiconductor layer to be in positional alignment with the via hole, the length of the current path supplied between the electrodes during operation is reduced to a value substantially equal to the thickness of the GaN semiconductor layer, which is much shorter than the length of the current path in a conventional device.

The Invention has been made taking these researches by the Inventor into account.

That is, according to the first aspect of the invention, there is provided a manufacturing method of a semiconductor device, comprising the steps of:

making a device using nitride III-V compound semiconductors on one major surface of a single-crystal substrate made of a material different from nitride III-V compound semiconductors;

thinning the single-crystal substrate by processing the other major surface of the single-crystal substrate by lapping using an abrasive liquid containing an abrasive material of diamond abrasive grains and reducing the grain size of the abrasive material in plural steps; and removing a strained layer produced on the other major surface of the single-crystal substrate during the lapping by etching the other major surface of the single-crystal substrate after lapping by using an etchant containing phosphoric acid or phosphoric acid and sulfuric acid as its major component and heated to 150 through 450° C.

In the first aspect of the invention, the single-crystal substrate is thinned typically by lapping to a thickness not larger than 100 $\mu$m, or a thickness not larger than decades of $\mu$m. In order to prevent any damage to the device upon etching for removing a strained layer by lapping, the surface of the device made on one major surface of the single-crystal substrate is preferably covered by a protective film having a resistance to the etchant prior to the etching. Usable as the protective film are, for example, a silicon oxide ($SiO_2$) film, silicon nitride (SiN) film are polyimide film. During the etching, it is preferable to immerse only the other major surface of the single-crystal substrate into the etchant.

According to the second aspect of the invention, there is provided a semiconductor device having a single-crystal substrate made of a material different from nitride III-V compound semiconductors, and a device made on one major surface of the single-crystal substrate by using III-V compound semiconductors, comprising:

electrical connection to the device being made through a via hole formed in the single-crystal substrate.

According to the third aspect of the invention, there is provided a manufacturing method of a semiconductor device having a single-crystal substrate made of a material different from nitride III-V compound semiconductors and a device made on one major surface of the single-crystal substrate by using III-V compound semiconductors, in which electrical connection to the device is made through a via hole formed in the single-crystal substrate, comprising the step of:

forming the via hole by selectively etching the other major surface of the single-crystal substrate by using an etchant containing as its major component phosphoric acid or phosphoric acid and sulfuric acid heated to 150 through 450° C.

In the third aspect of the invention, an etching mask made of a first thin film of Cr, Ti or Ni and a second thin film of Pt, Pd or Au thereon is made on the other major surface of the single-crystal substrate, and the via hole is made by etching the single-crystal substrate, using the etching mask. During the etching, it is preferable to immerse only the other major surface of the single-crystal substrate into the etchant.

According to the fourth aspect of the invention, there is provided a manufacturing method of a semiconductor device having a single-crystal substrate made of a material different from nitride III-V compound semiconductors and a device made on one major surface of the single-crystal substrate by using III-V compound semiconductors, in which electrical connection to the device is made through a via hole formed in the single-crystal substrate, comprising the steps of:

making a hole as deep as 10 μm or more but not reaching one major surface of the substrate by selectively irradiating laser light having a wavelength not shorter than 6 μm onto the other major surface of the single-crystal substrate; and making the via hole by etching the other major surface of the single-crystal substrate by using an etchant containing as its major component phosphoric acid or phosphoric acid and sulfuric acid heated to 150 through 450° C. so as to make the hole reach the one major surface.

In the fourth aspect of the invention, pulse laser light having the wavelength of 10.6 μm from a $CO_2$ laser, for example, is used as the laser light.

In the present invention, any appropriate shape of the via hole in the single-crystal substrate can be selected where necessary. For example, it may be circular or rectangular (including those extending long in form of a slit). The via hole may be one per one device, or a plurality of such via holes may be made in one device. When providing a plurality of via holes, they are aligned in a single row, a plurality of rows, or may be arranged variously.

In the invention, the single-crystal substrate is a sapphire substrate, spinel substrate, perovskite yttrium alminate (YAP) substrate or SiC substrate, for example.

In the present invention, each nitride III-V compound semiconductor includes at least Ga and N, and may additionally include one or more group III elements selected from the group consisting of Al, In and B and/or one ore more group V elements selected from the group consisting of As and P. Some specific examples of nitride III-V compound semiconductors are GaN, AlGaN, GaInN and AlGaInN.

In the present invention, the semiconductor device may be an electron transport device such as field effect transistor (FET), or a light emitting device such as semiconductor laser or light emitting diode.

According to the first aspect of the invention having the above-summarized construction, since the single-crystal substrate is thinned by lapping of the other major surface of the single-crystal substrate while reducing the grain size of the abrasive material in some steps, the single-crystal substrate can be thinned to a desired thickness without inviting warpage or breakage even if the single-crystal substrate is extremely hard such as sapphire substrate or SiC substrate, while minimizing a strained layer caused by lapping. Then, by etching the other major surface of the thinned single-crystal substrate by using an etchant containing as its major component phosphoric acid of phosphoric acid and sulfuric acid heated to 150 through 450° C., the strained layer produced on the other major surface of the single-crystal substrate during lapping can be removed.

According to the second aspect of the invention having the above-summarized construction, since electrical connection to the device is made through the via hole made in the single-crystal substrate, if the device is FET, the source inductance can be reduced. When a light emitting device using nitride III-V compound semiconductors is made on a nonconductive single-crystal substrate, by making the via hole from the bottom of the single substrate in alignment with one of electrodes made on the nitride III-V compound semiconductors, and bringing the other electrode into contact with the lower surface of the nitride III-V compound semiconductor layer through the via hole to make electric connection of the other electrode with the light emitting device, the path of a current flowing between these electrodes during operation can be reduced to a much shorter length substantially equal to the thickness of the nitride III-V compound semiconductor layers.

According to the third aspect of the invention having the above-summarized construction, since the via hole is made by selectively etching the other major surface of the single-crystal substrate by using an etchant containing as its major component phosphoric acid or phosphoric acid and sulfuric acid heated to 150 through 450° C., the via hole can be made easily in any desired location of the single-crystal substrate.

According to the fourth aspect of the invention having the above-summarized construction, by selectively irradiating laser light having a wavelength of 6 μm or more onto the other major surface of the single-crystal substrate to make a hole as deep as 10 μm and not reaching one major surface, and thereafter etching the other major surface of the single-crystal substrate by using an etchant containing as its major component phosphoric acid or phosphoric acid and sulfuric acid heated to 150 through 450° C. to make the hole reach one major surface of the substrate, the via hole can be made easily by a maskless process in any desired location of the single-crystal substrate.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
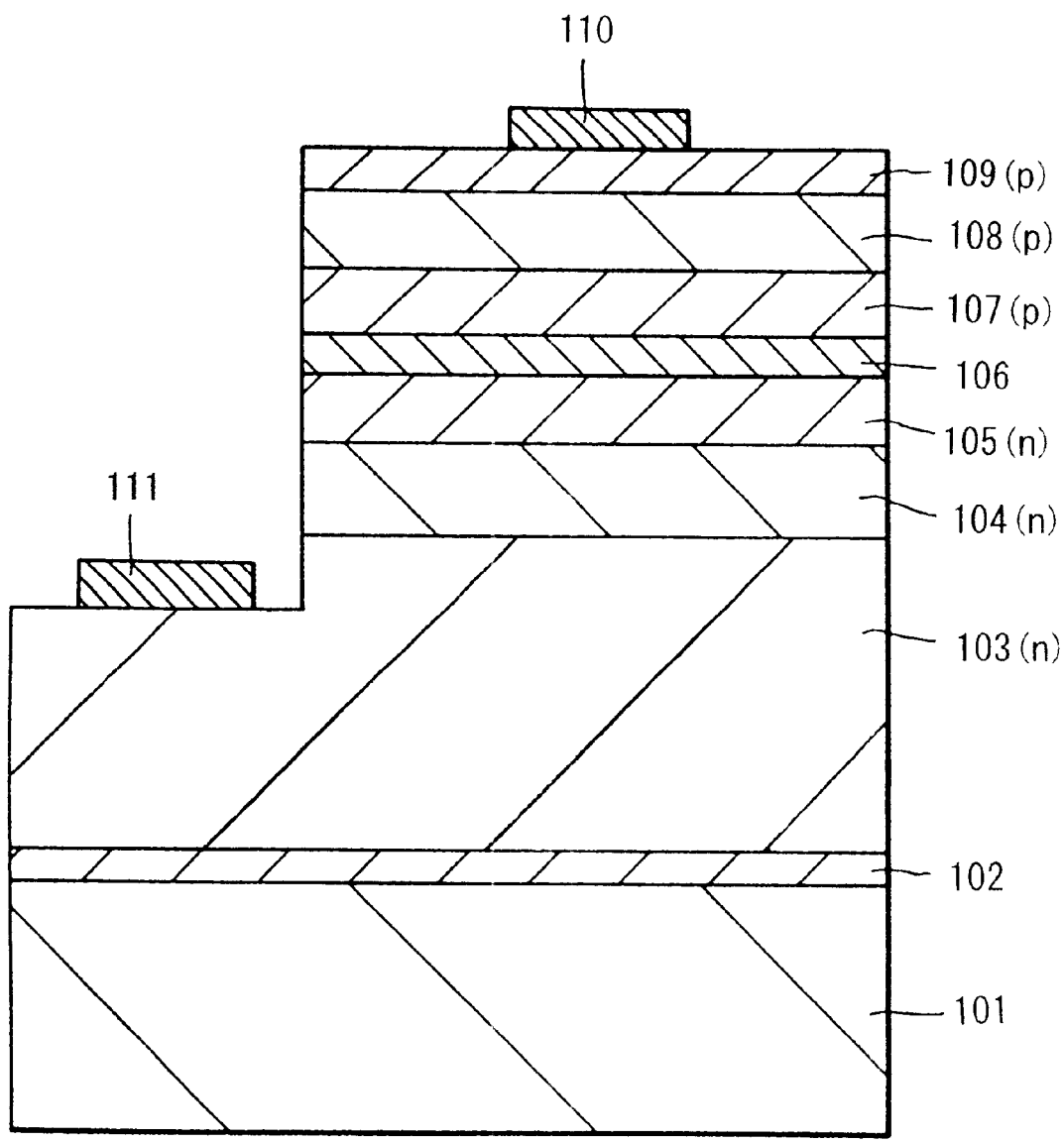
FIG. 1 is a cross-sectional view showing a conventional GaN semiconductor laser.
Figure 2:
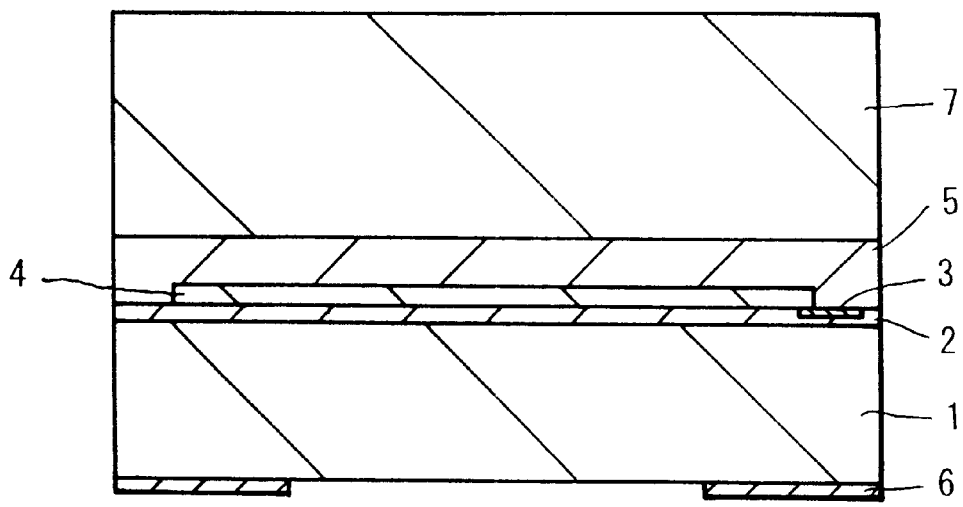
FIG. 2 is a cross-sectional view for explaining the invention.
Figure 3:
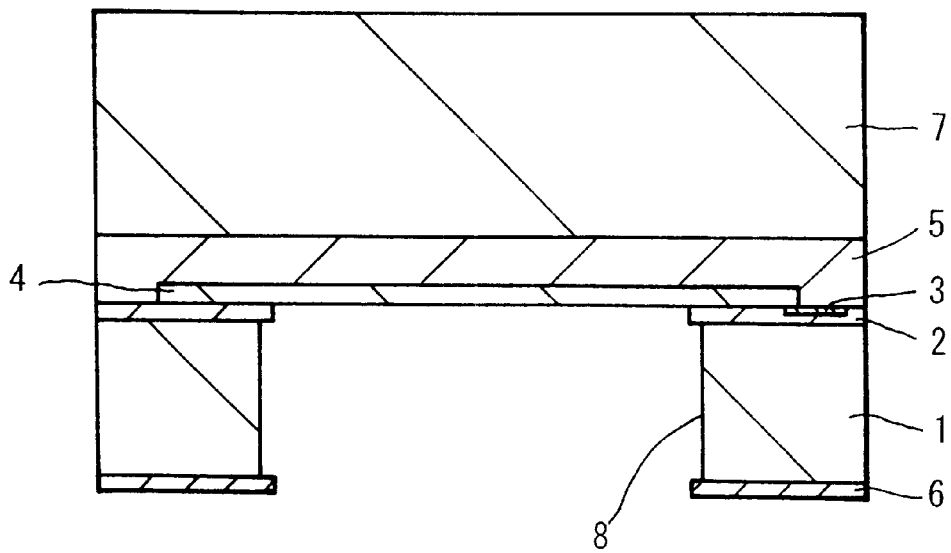
FIG. 3 is a cross-sectional view for explaining the invention.
Figure 4:
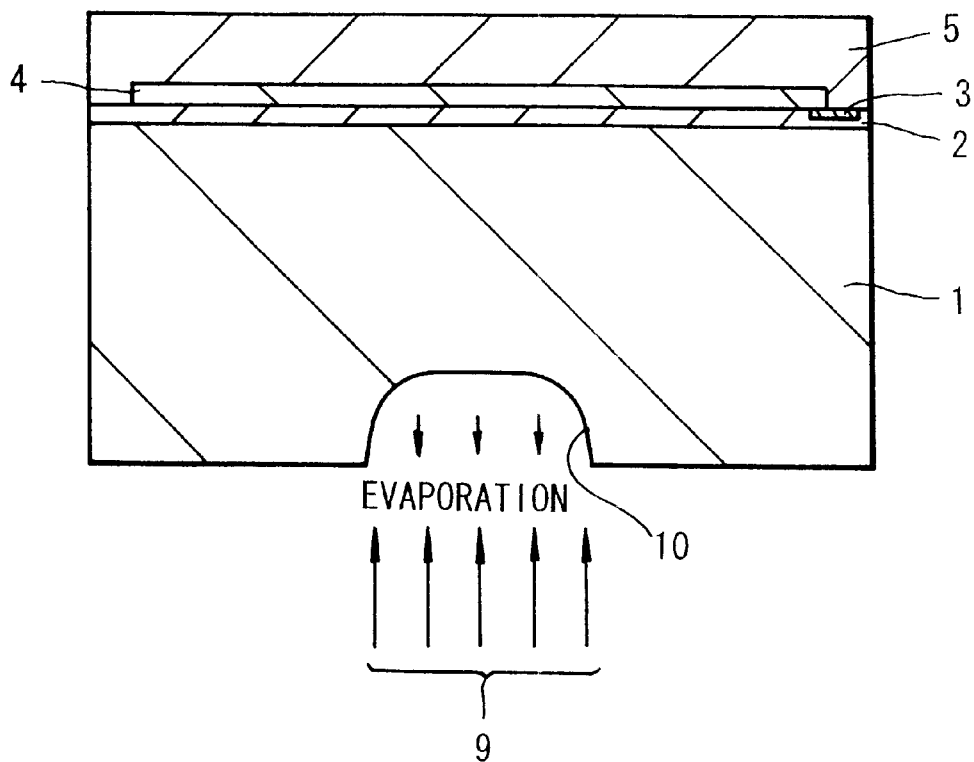
FIG. 4 is a cross-sectional view for explaining the invention.
Figure 5:
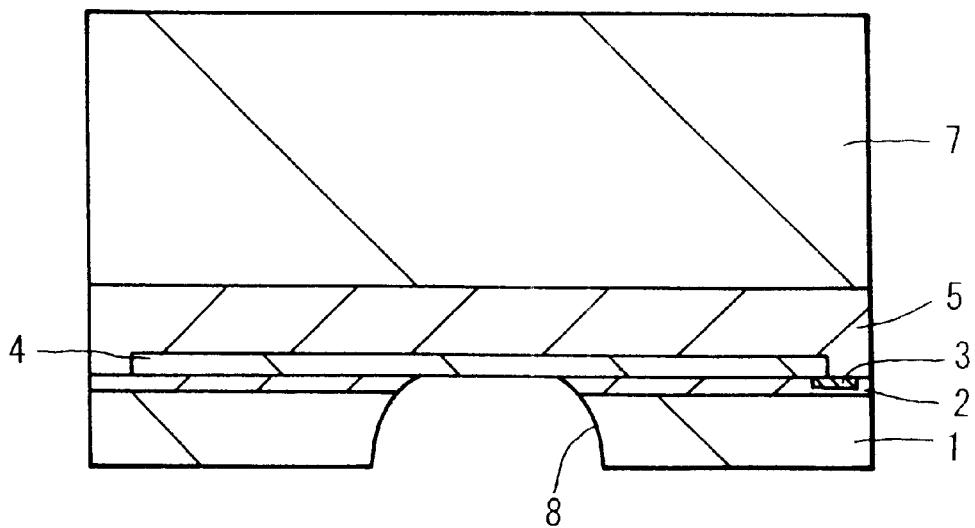
FIG. 5 is a cross-sectional view for explaining the invention.
Figure 6:
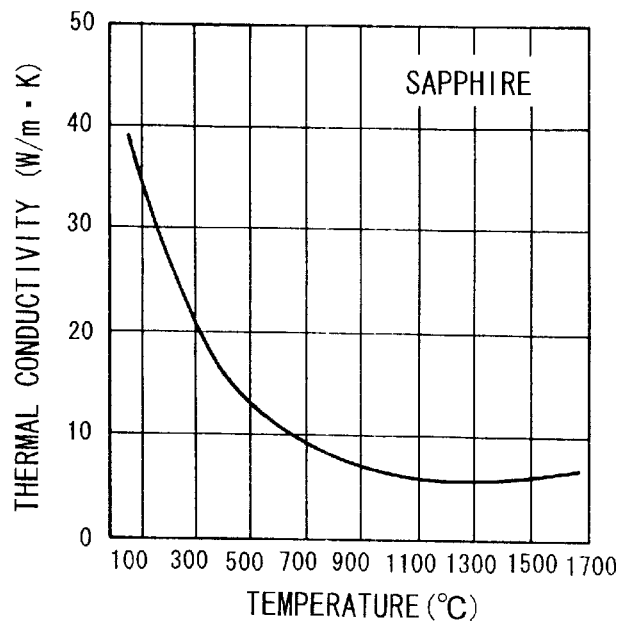
FIG. 6 is a schematic diagram showing dependency of heat conductivity of sapphire upon temperature.

Explained below are embodiments of the invention with reference to the drawings. In all of the drawings illustrating these embodiments, the same or equivalent components or elements are labeled with common reference numerals.

FIGS. 7 through 11 show a manufacturing method of a GaN FET according to the first embodiment of the invention.

Figure 7:
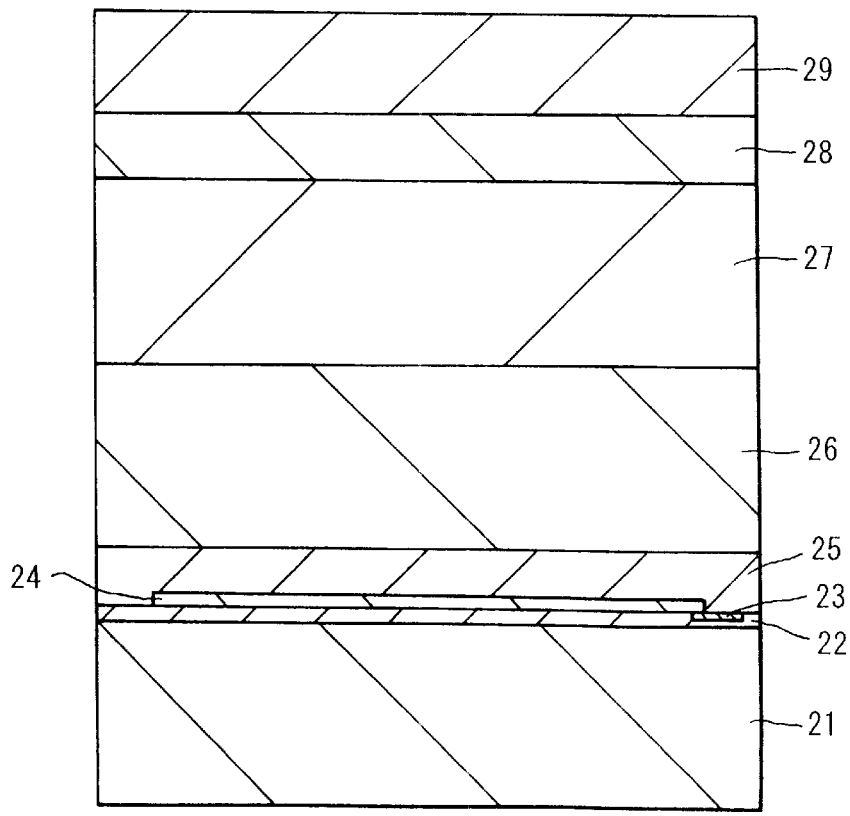
FIG. 7 is a cross-sectional view for explaining a manufacturing method of GaN FET according to the first embodiment of the invention.

In the first embodiment, as shown in FIG. 7, a GaN semiconductor layer 22 is first grown on the surface of a sapphire substrate 21, and a GaN FET 23 is made on the GaN semiconductor layer 22. The sapphire substrate 21 is approximately 400 $\mu$m thick, for example, and the GaN semiconductor layer 22 is approximately 4 $\mu$m thick, for example. Next formed are a metal wiring and a pad for the GaN FET 23. Reference numeral 24 denotes a Au pad electrically connected to the source of the GaN FET 23. Thereafter, an interlayer insulating film 25 such as $SiO_2$ film is formed on the GaN semiconductor layer 22 to cover the Au pad 24. Subsequently, a protective film 26 is made on the inter-layer insulating film 25. A heat-resistant polyimide film with the thickness of 10 $\mu$m, for example, is used as the protective film 26. After that, a Si substrate 27 is put on and bonded to the protective film 26. Thickness of the Si substrate is approximately 250 $\mu$m, for example. The Si substrate 27 is used to prevent warpage of the sapphire substrate 21 after being thinned by lapping and to have the sapphire substrate 21 be handled easily. Thereafter, a lapping tool 29 is bonded onto the Si substrate 27 via wax 28.

Figure 8:
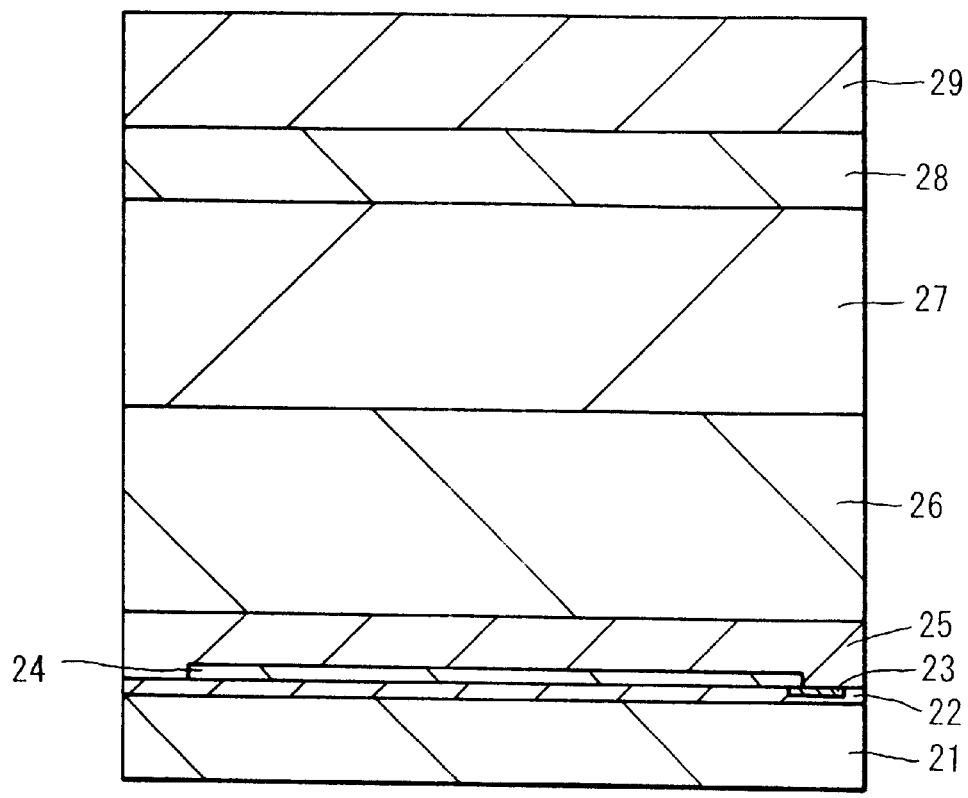
FIG. 8 is a is a cross-sectional view for explaining a manufacturing method of GaN FET according to the first embodiment of the invention.

Subsequently, the sample is set on a palling platform in a lapping apparatus, not shown, and lapping of the bottom surface of the sapphire substrate 21 is executed in a abrasive liquid, which may be a water solution containing an abrasive material of diamond abrasive grains with the grain size of 20 to 40 $\mu$m. When thickness of the sapphire substrate 21 is reduced to approximately 200 $\mu$m, for example, by the lapping, the sample and the lapping platform are washed to remove the abrasive liquid. After that, lapping of the bottom surface of the sapphire substrate 21 is executed in an abrasive liquid, which may be a water solution containing an abrasive material of diamond abrasive grains with a grain size of 5 to 12 $\mu$m, for example. When thickness of the sapphire substrate is reduced to approximately 100 $\mu$m for example, by the lapping, the lapping process is finished. In this manner, the sapphire substrate 21 is thinned to approximately 100 $\mu$m, as shown in FIG. 8. After that, the sample is warmed on a hot plate (not shown), the lapping tool 29 is detached, and the wax 28 is removed.

Thereafter, the bottom surface of the sapphire substrate 21 thinned to approximately 100 $\mu$m in this manner is immersed into an etchant of phosphoric acid ($H_3PO_4$) /sulfuric acid ($H_2SO_4$) mixed liquid heated to 285° C., for example, to etch it. This etching may be done in the following process.

Figure 9:
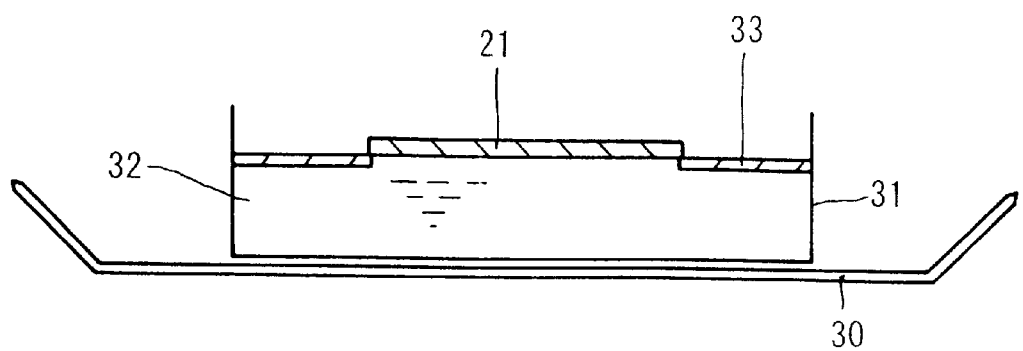
FIG. 9 is a cross-sectional view for explaining a manufacturing method of GaN FET according to the first embodiment of the invention.

That is, as shown in FIG. 9, a Pt container 31 in form of a Petri dish containing an etchant 32 of $H_3PO_4/H_2SO_4$ mixed liquid by $H_3PO_4:H_2SO_4=1:1$ is put on the hot plate 30. The etchant 32 is previously heated to an etching temperature by the hot late 30. Thereafter, held on the etchant 32 is a float cover 33 of a doughnut-shaped Pt plate having an outer diameter slight larger than the diameter of the Pt container 31 and an inner diameter slightly smaller than the diameter of the sapphire substrate 21. At that time, the float cover 33 is held so that its upper surface be in the same level as the liquid surface of the etchant 32. The float cover 33 is used to prevent evaporation of moisture from the etchant 32 of $H_3PO_4/H_2SO_4$ mixed liquid to thereby maintain composition of $H_3PO_4$ constant, and also to ensure that only the bottom surface of the sapphire substrate 21 contacts the etchant 32. Then, the sapphire substrate 21 is put on the float cover 33 to align its outer circumferential with the inner circumferential edge of the float cover 33. In this state, only the bottom surface of the sapphire substrate 21 contacts the etchant 32. As a result, only the bottom surface of the sapphire substrate 21 is etched, and a strained layer produced by lapping is removed.

Figure 10:
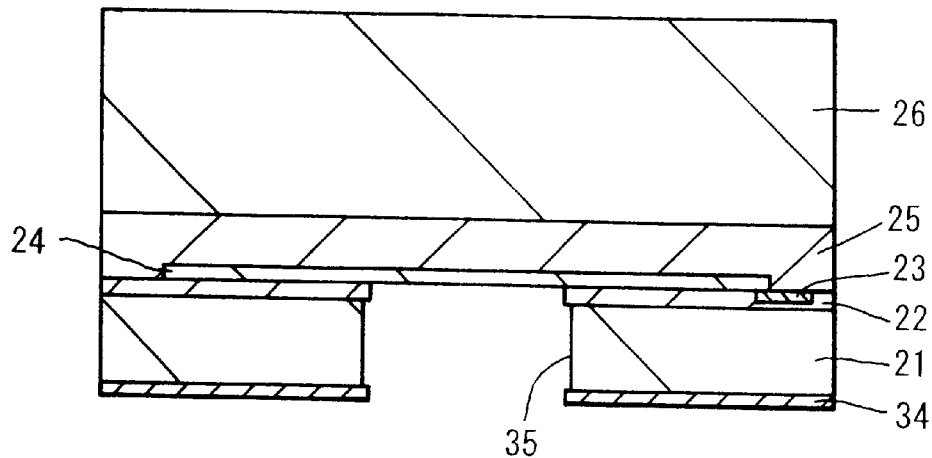
FIG. 10 is a cross-sectional view for explaining a manufacturing method of GaN FET according to the first embodiment of the invention.
Figure 11:
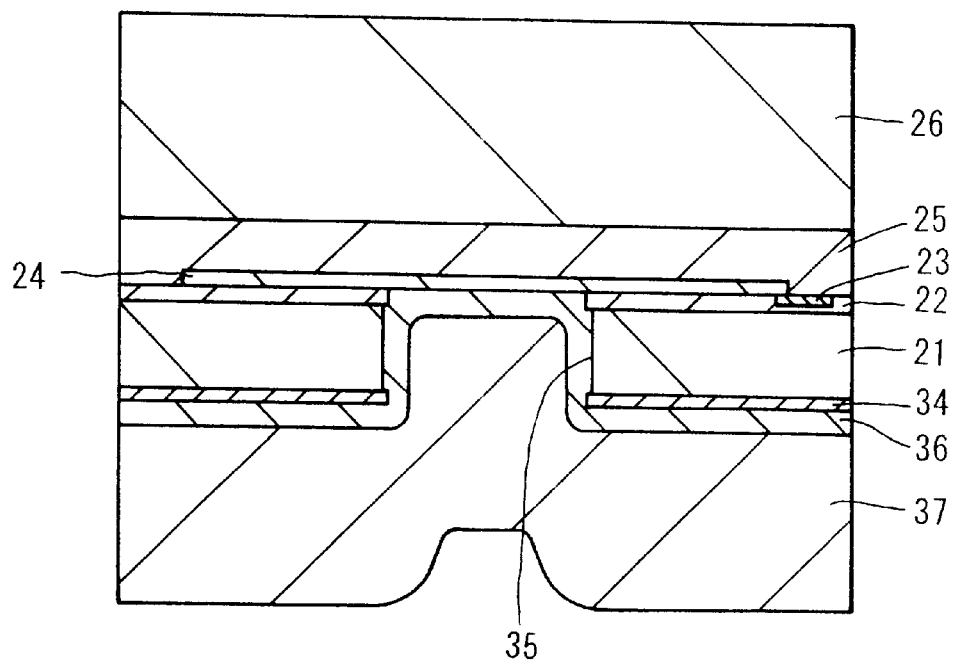
FIG. 11 is a cross-sectional view for explaining a manufacturing method of GaN FET according to the first embodiment of the invention.

Next as shown in FIG. 10, after a resist pattern (not shown) having a shape corresponding to the via hole to be made is formed on a location of the bottom surface of the sapphire substrate corresponding to the Au pad 24, a Cr film with the thickness of 20 nm, for example, and a Pt film with the thickness of 0.1 $\mu$um, for example, are sequentially made thereon by vacuum evaporation, for example. After that, by lifting, the resist pattern is removed together with the Cr film and Pt film thereon. In this manner, an etching mask 34 made of the Cr/Pt film is obtained. Thereafter, using the etching mask 34, the bottom surface of the sapphire substrate 21 is immersed into the etchant of $H_3PO_4/H_2SO_4$ heated to 285° C., for example, similarly to the above-explained manner, for approximately 3 hours, for example, to selectively etch the sapphire substrate 21 until exposing the GaN semiconductor layer 22. As a result, a via hole 35 is made in the sapphire substrate 21.

Thereafter, the sapphire substrate 21 is introduced into a RIE apparatus, not shown, and the GaN semiconductor layer 22 is selectively removed from the bottom side of the sapphire substrate 21 by etching, using $Cl_2$ gas, for example, as the etching gas, and using the sapphire substrate 21 as a mask. In this case, the etching rate may be approximately 10 $\mu$m/hr, for example. Then, is the thickness of the GaN semiconductor layer 22 is approximately 4 μm, the GaN semiconductor layer 22 can be removed by etching to expose the Au pad 24 in approximately 25 minutes.

Next as shown in FIG. 11, here again, by vacuum evaporation, for example, a 20 nm thick Cr film and a 5 μm thick Au film, for example, are sequentially stacked to form a Cr/Au film 36. Thereafter, a Au film 37 having a thickness as sufficiently thick as approximately 100 μm, for example, is made on the Cr/Au film 36 by plating, for example. The, the protective 26 of polyimide is removed by using an organic solvent.

Through these steps, the GaN FET 23 is completed, which is made on the sapphire substrate 21 thinned to approximately 100 μm and having the thick Au film 37 electrically connected from the substrate bottom side to the Au pad as the source pad through the via hole 35 formed in the sapphire substrate 21.

As explained above, according to the first embodiment, after GaN FET 23 is made by growing the GaN semiconductor layer 22 on the surface of the sapphire substrate 1, the bottom surface of the sapphire substrate is removed by lapping to a thickness around 200 μm as the first step by using the abrasive liquid of water solution containing diamond abrasive grains with the grain size of 20 to 40 μm, and it is removed by lapping to the thickness of 100 μm as the second step by using the abrasive liquid of water solution containing diamond abrasive grains with the grains size of 5 to 12 μm. Therefore, the sapphire substrate 21 can be thinned to a thickness around 100 μm, while preventing warpage or breakage of the sapphire substrate 21 by lapping end minimizing the strained layer produced by lapping. Additionally, since the bottom surface of the sapphire substrate 21 is etched after lapping by using the etchant of $H_3PO_4/H_2SO_4$ mixed liquid, the strained layer appearing on the bottom of the sapphire substrate 21 upon lapping can be removed completely. Then, since the thinned sapphire substrate 21 permits heat to be radiated well to the Au film 37 behaving as a heat sink, increase in temperature of the GaN FET 23 can be alleviated remarkably. As a result, increase of the gate leak and decrease of the carrier mobility can be prevented, and high-frequency characteristics of the GaN FET 23 can be maintained even under operation for high-power output. Moreover, since increase in temperature of the GaN FET 23 is greatly alleviated, the device prevents migration at the metal wiring and deterioration of the inter-layer insulating film 25, and its reliability is therefore improved. furthermore, since the via hole 35 is made in the sapphire substrate 21 from its bottom surface to electrically connect the Au film 37 to the Au pad 24 through the via hole 35, the source inductance is large reduced toward realization of high-frequency operation. For these reasons, the GaN FET 23 with a high frequency, high output power and high performance can be realized. Additionally, because of significant alleviation of increase in temperature of the GaN FET 23, GaN FETs 23 can be densely integrated on the sapphire substrate 21, and it results in further increasing the output of the device.

Next explained is a manufacturing method of a GaN FET according to the second embodiment of the invention.

In the second embodiment, in the same manner as the first embodiment, the sapphire substrate 21 is first thinned to approximately 200 μm.

Figure 12:
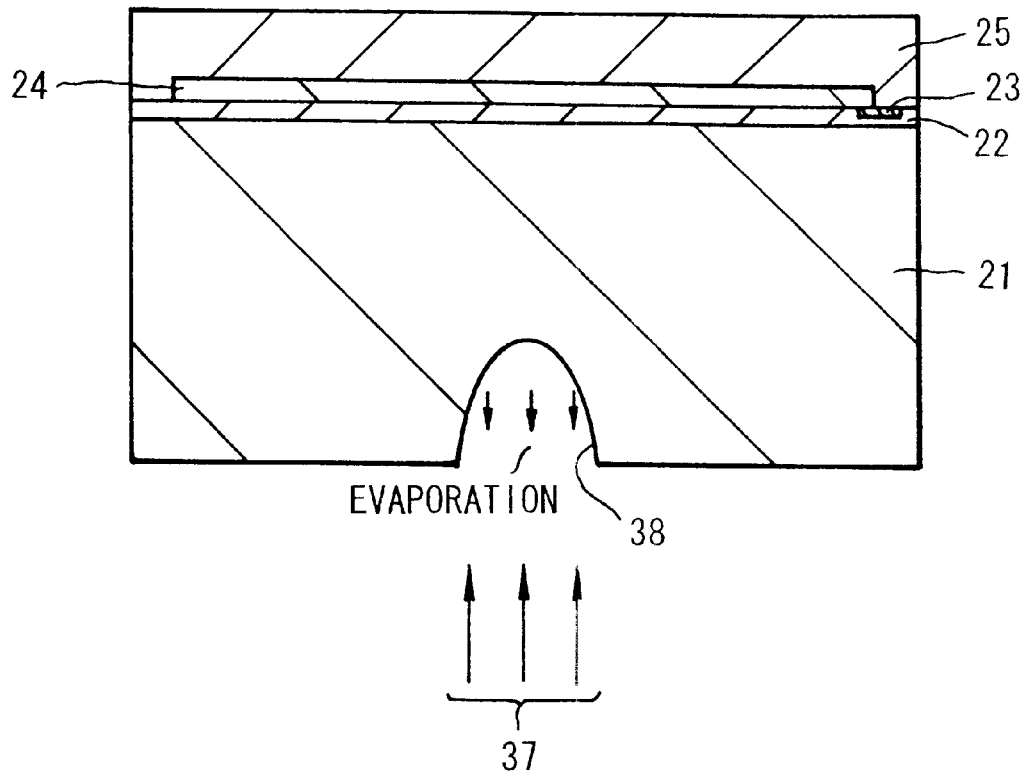
FIG. 12 is a cross-sectional view for explaining a manufacturing method of GaN FET according to the second embodiment of the invention.

Next as shown in FIG. 12, a pulse laser beam 37 of the wavelength 10.6 μm from a $CO_2$ laser, for example, is irradiated onto the bottom surface of the thinned sapphire substrate 21 to make a hole 38 having a warhead-like shape, for example, and not reaching the surface of the sapphire substrate 21. Used as the pulse laser beam 37 is one having the leading output of 150 W, pulse width of 200 μs and the beam diameter of approximately 100 μm, foe example. By irradiating a single pulse of the pulse laser beam 39 to one point in the region of the Au pad 24, a hole 38 having a diameter around 100 μm on the bottom surface of the sapphire substrate 21 and a depth around 100 μm can be made.

Figure 13:
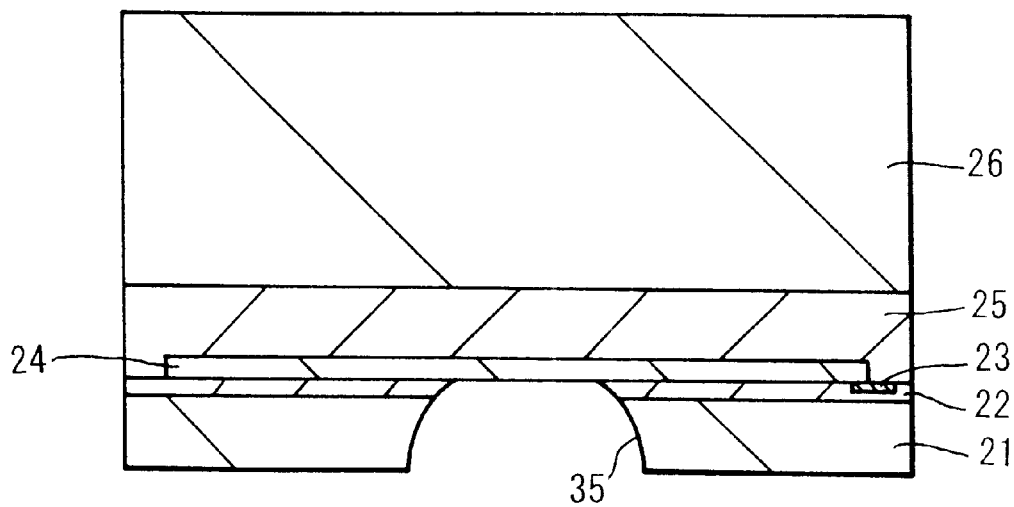
FIG. 13 is a cross-sectional view for explaining a manufacturing method of GaN FET according to the second embodiment of the invention.

Next using an etchant of mixed liquid, similarly to the above-explained method, the bottom surface of the sapphire substrate 21 is processed by maskless non-selective etching. As a result, thickness of the sapphire substrate 21 is reduced uniformly. For example, by etching of 10 hours, the sapphire substrate 21 is removed from the location corresponding to the Au pad 24, and the via hole 35 is formed to expose the GaN semiconductor layer 22 at the bottom thereof as shown in FIG. 13. At that time, the sapphire substrate 21 is etched not only in the depth direction but also in the lateral direction. as a result, diameter of the via hole 35 on the bottom surface of the sapphire substrate 21 becomes larger than the diameter of the hole 38 initially made. Therefore, by controlling the etching conditions, the diameter of the GaN semiconductor layer 22 circularly exposed at the bottom of the via hole 35 can be determined as desired. After that, in the same manner as already explained, the GaN semiconductor layer 22 circularly exposed at the bottom of the via hole 35 is removed to expose the Au pad 24, and the Cr/Au film 36 and the Au film 37 are made, to complete fabrication of the GaN FET 23.

According to the second embodiment, similarly to the first embodiment, by thinning the sapphire substrate 21 and making the via hole 35 in the sapphire substrate 21, a high-frequency, high-output, high-performance GaN FET 23 can be realized. Additionally, according to the second embodiment, since the via hole 35 can be made in the maskless process, it simplifies the manufacturing process as an additional advantage.

Next explained is a GaN semiconductor laser according to the third embodiment of the invention. This GaN semiconductor laser has a SCH (Separate Confinement Heterostrucure) structure.

Figure 14:
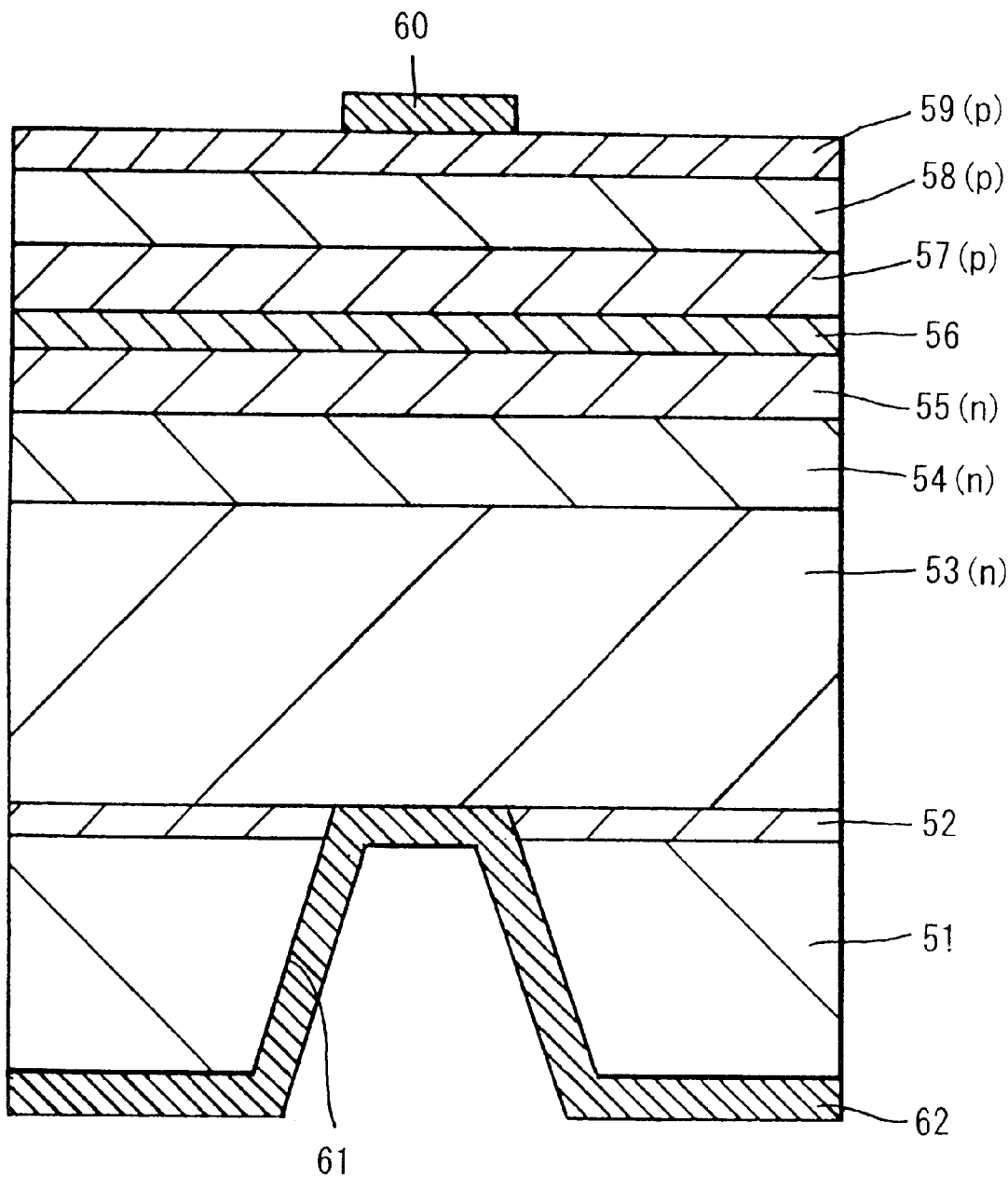
FIG. 14 is a cross-sectional view for explaining a manufacturing method of GaN FET according to the third embodiment of the invention.

As shown in FIG. 14, in the GaN semiconductor laser, sequentially stacked on a c-plane sapphire substrate 51 are a GaN buffer layer 52, n-type GaN contact layer 53, n-type AlGaN cladding layer 54, n-type GaN optical guide layer 55, active layer 56 having a $Ga_{1-x}In_xN/Ga_{1-y}In_yN$ multi quantum well structure, p-type GaN optical guide layer 57, p-type AlGaN cladding layer 58 and p-type GaN contact layer 59. Additionally, a p-side electrode 60 of a stripe-shaped Ni/Au structure or Ni/Pt/Au structure, for example, is made on the p-type GaN contact layer 59 in ohmic contact therewith. In the c-plane sapphire substrate 51, a via hole 61 is formed in a location in alignment with the p-side electrode 60, and an n-side electrode 61 of a Ti/Al structure, for example, is made in ohmic contact with the n-type GaN contact layer 53 through the via hole 61. The via hole 61 may be either a plurality of circular or rectangular holes aligned in equal intervals in the extending direction of the p-side electrode or a slit-shaped single hole extending in the extending direction of the p-side electrode 60 and slightly shorter than the cavity length. Alternatively, it may be a combination of these two structures.

Next explained is a manufacturing method of the GaN semiconductor laser according to the third embodiment having the above-explained structure.

For manufacturing the GaN semiconductor laser, the GaN buffer layer 52 is first grown on the c-plane sapphire substrate 51 by MOCVD at the temperature of 560° C., for example. Thereafter, sequentially stacked on the GaN buffer layer 52 are the n-type GaN contact layer 53, n-type AlGaN cladding layer 54, n-type GaN optical guide layer 55, active layer 56 of the $Ga_{1-x}In_xN/Ga_{1-y}In_xN$ multi quantum well structure, p-type GaN optical guide layer 57, p-type AlGaN cladding layer 58 and p-type GaN contact layer 59. Growth temperature is set to approximately 1000° C. for growth of layers not containing In, namely, n-type GaN contact layer 53, n-type AlGaN cladding layer 54, n-type GaN optical guide layer 55, p-type GaN optical guide layer 57, p-type AlGaN cladding layer 58 and p-type GaN contact layer 59, and approximately 700 to 800° C. for growth of the layer containing In, namely, active layer 55 having the $Ga_{1-x}In_xN/Ga_{1-y}In_yN$ multi quantum well structure. Source materials used for growth of these nitride III-V compound semiconductor layers are, for example, trimethyl gallium (TMGa) as the source material of a group III element Ga, trimethyl aluminum (TMAl) as the source material of a group III element Al, trimethyl indium (TMIn) as the source material of a group III element In, and ammonium ($NH_3$) as the source material of a group V element N. Used as the carrier gas is a mixed gas of hydrogen ($H_2$) and nitrogen ($N_2$), for example. Dopants used here are monosilane ($SiH_4$), for example, as the n-type dopant, and bismethylcyclopentadienile magnesium, for example, as the p-type dopant. After that, the product is annealed for electrically activating the p-type impurity doped into the p-type layers, namely, p-type GaN optical guide layer 57, p-type AlGaN cladding layer 58 and p-type GaN contact layer 59. This annealing is executed in a nitrogen gas atmosphere, for example, at a temperature around 800° C.

Thereafter, the p-side electrode 60 is made on the p-type GaN contact layer 59 by lift-off, for example.

Subsequently, using the same method as used in the first and second embodiments, the via hole 61 is made by selecting removing a part of the c-plane sapphire substrate in alignment with the p-side electrode 60 from the bottom thereof. Thereafter, part of the GaN buffer layer 52 exposed inside the via hole 61 is removed by etching using an alkali solution to expose the lower surface of the n-type GaN contact layer 53.

After that, the n-side electrode 62 is made by depositing a Ti/Al film on the entire bottom surface of the c-plane sapphire substrate 51 by vacuum evaporation, for example.

The c-plane sapphire substrate 51 having formed the laser structure as explained above is divided into bars to make opposite cavity edges, and each bar is divided into chips. Through these steps, the intended GaN semiconductor laser having a SCH structure is completed.

As explained above, according to the third embodiment, since the n-side electrode 62 is brought into ohmic contact with the n-type GaN contact layer 53 from its lower surface through the via hole 61 formed in the c-plane sapphire substrate 51 in alignment with the p-side electrode 60, the length of the path of a current flowing between the p-side electrode 60 and the n-side electrode 62 during operation of the GaN semiconductor laser is equal to the total thickness of the n-type GaN contact layer 53, n-type AlGaN cladding layer 54, n-type GaN optical guide layer 55, active layer 56, p-type GaN optical guide layer 57, p-type AlGaN cladding layer 58 and p-type GaN contact layer 59, and much shorter than the current path in a conventional GaN semiconductor laser. Therefore, the operation voltage of the GaN semiconductor laser can be reduced so much.

Additionally, since the GaN semiconductor laser has its p-side electrode on the surface side of the substrate and the n-side electrode on the bottom side of the substrate similarly to GaAs semiconductor lasers, it can be assembled by using any apparatus used for assembling GaAs semiconductor lasers, and no special assembling apparatus need not be prepared. Therefore, the manufacturing cost of the GaN semiconductor laser can be reduced so much.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, materials, structures and processes introduced in the first, second and third embodiments are not but examples, and any other appropriate numerical values, materials, structures and processes may be used.

Although the first embodiment has been explained as bonding the surface side of the sapphire substrate to the Si substrate 27 prior to lapping, the Si substrate 27 may be omitted where appropriate.

The third embodiment has been explained as applying the invention to GaN semiconductor lasers having a SCH structure. However, the invention is also applicable to GaN semiconductor lasers having a DH (Double Heterostructure) structure and GaN light emitting diodes.

As described above, according to the first aspect of the invention, when a device using nitride III-V compound semiconductors is made on a hard and chemically stable single-crystal substrate such as sapphire substrate or SiC substrate, its high-power output can be ensured by thinning the substrate.

According to the second aspect of the invention, when a device using nitride III-V compound semiconductors is made on a hard and chemically stable single-crystal substrate such as sapphire substrate or SiC substrate, and particularly when the device is FET, by electric connection of the device through a via hole made in the single-crystal substrate, the source inductance can be decreased, and high-frequency operation is ensured. Alternatively, when a light emitting device using nitride III-V compound semiconductors is made on a non-conductive single-crystal substrate such as sapphire substrate, it is possible to reduce the operation voltage of the light emitting device and to reduce its manufacturing cost.

According to the third or fourth aspect of the invention, when making a device using nitride III-V compound semiconductors on a hard, chemically stable single-crystal substrate such as sapphire substrate or SiC substrate, and electrically connecting the device through a via hole made in the single-crystal substrate, the via hole can be made easily in the single-crystal substrate.

What is claimed is:

1. A manufacturing method of a semiconductor device, comprising the steps of:
   making a device using nitride III-V compound semiconductors on one major surface of a single-crystal substrate made of a material different from nitride III-V compound semiconductors;
   thinning said single-crystal substrate by processing the other major surface of said single-crystal substrate by lapping using an abrasive liquid containing an abrasive material of diamond abrasive grains while reducing the grain size of said abrasive material in plural steps; and removing a strained layer produced on said other major surface of said single-crystal substrate during said lapping by etching said other major surface of said single-crystal substrate after said lapping by using an etchant containing phosphoric acid or phosphoric acid and sulfuric acid as its major component and heated to 150 to 450° C.

2. The manufacturing method of a semiconductor device according to claim 1 wherein said single-crystal substrate is thinned to a thickness not larger than 100 µm.

3. The manufacturing method of a semiconductor device according to claim 1 wherein the surface of said device made on said one major surface of said single-crystal substrate is covered by a protective film having a resistance to said etchant before said other major surface of said single-crystal substrate is etched.

4. The manufacturing method of a semiconductor device according to claim 3 wherein said protective film is a silicon oxide film, silicon nitride film or polyimide film.

5. The manufacturing method of a semiconductor device according to claim 1 wherein said other major surface of said single-crystal substrate is etched by immersing only said other major surface of said single-crystal substrate into said etchant.

6. The manufacturing method of a semiconductor device according to claim 1 wherein said single-crystal substrate is a sapphire substrate, spinel substrate, perovskite yttrium aluminate substrate or SiC substrate.

7. The manufacturing method of a semiconductor device according to claim 1 wherein said semiconductor device is a semiconductor laser using nitride III-V compound semiconductors.

8. The manufacturing method of a semiconductor device according to claim 1 wherein said semiconductor device is a FET using nitride III-V compound semiconductors.

* * * * *